United States Patent [19]

Sano

[11] Patent Number: 5,748,006

[45] Date of Patent: May 5, 1998

[54] HIGH-FREQUENCY-TRANSMISSION PRINTED WIRING BOARD, PROBE CARD, AND PROBE APPARATUS

[75] Inventor: Kunio Sano, Yamanashi-ken, Japan

[73] Assignee: Tokyo Electron Limited, Tokyo, Japan

[21] Appl. No.: 555,286

[22] Filed: Nov. 8, 1995

[30] Foreign Application Priority Data

Nov. 9, 1994 [JP] Japan ................... 6-300259

[51] Int. Cl.$^6$ ................................. G01R 31/02
[52] U.S. Cl. ................ 324/754; 333/33; 333/246
[58] Field of Search ..................... 324/754, 758; 333/33, 246, 248

[56] References Cited

U.S. PATENT DOCUMENTS

| | | | |
|---|---|---|---|
| 4,757,256 | 7/1988 | Whann et al. | 324/754 |
| 4,891,612 | 1/1990 | Gleason et al. | 333/33 |
| 5,003,273 | 3/1991 | Oppenberg | 333/1 |
| 5,148,103 | 9/1992 | Pasiecznik, Jr. | 324/754 |
| 5,225,037 | 7/1993 | Elder et al. | 156/644 |
| 5,311,406 | 5/1994 | Snodgrass et al. | 361/792 |
| 5,422,579 | 6/1995 | Yamaguchi | 324/758 |

Primary Examiner—Ernest F. Karlsen
Assistant Examiner—Anh Phung
Attorney, Agent, or Firm—Oblon, Spivak, McClelland, Maier & Neustadt, P.C.

[57] ABSTRACT

A probe card for examining the electrical characteristics of a plurality of IC chips formed on a semiconductor wafer has a card body and a printed wiring board. The card body has contact elements for contacting the electrodes pads of each IC chip. The printed wiring board has a plurality of transmission paths for transmitting a high-frequency signal to the contact elements. The printed wiring board has a plurality of signal lines disposed between first and second insulating layers, and first and second reference conductive plates opposing the signal lines through the first and second insulating layers, respectively. DC potentials that are different from each other are applied to the first and second reference conductive plates. The first and second reference conductive plates are arranged to be substantially offset from each other along each transmission path. The first and second reference conductive plates are arranged to slightly overlap each other. The overlapping amount is adjusted such that the impedances of the respective transmission paths are equal as a whole.

20 Claims, 5 Drawing Sheets

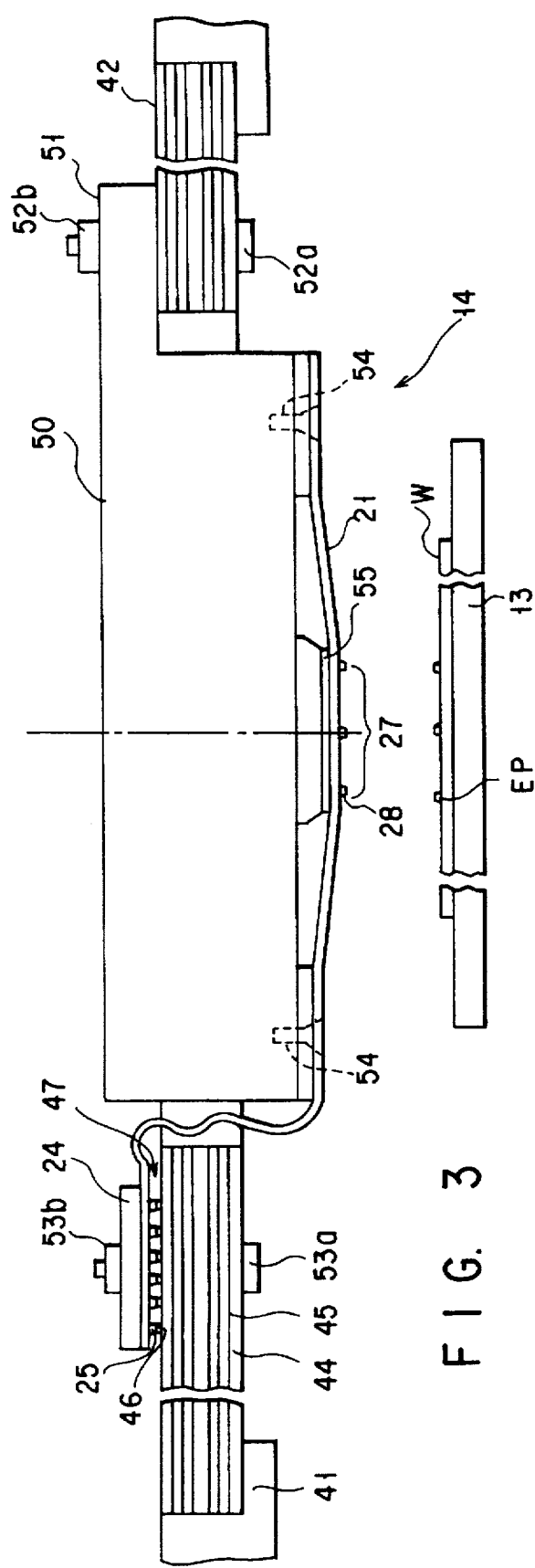
F I G. 3
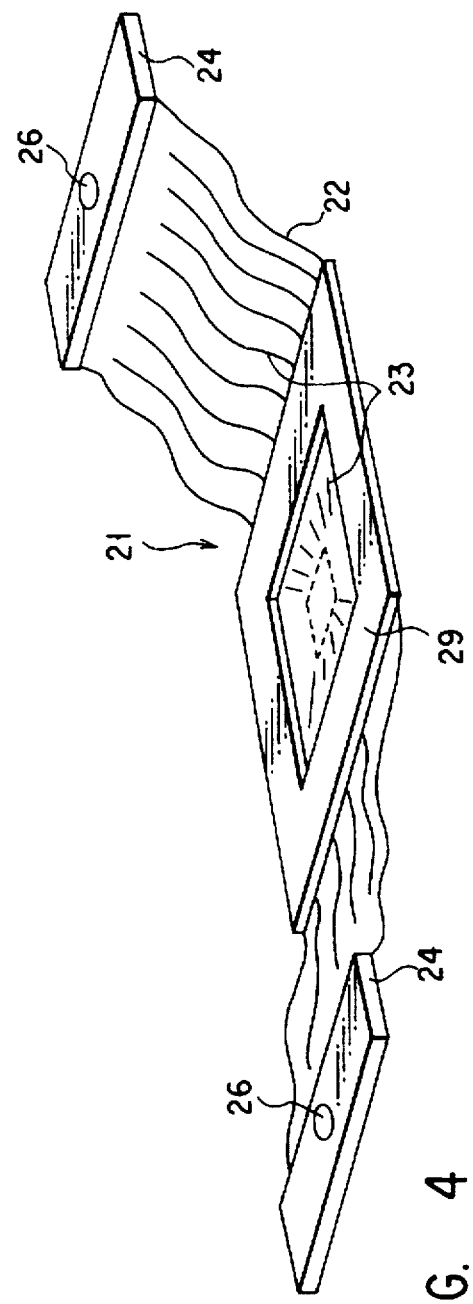
F I G. 4

HIGH-FREQUENCY-TRANSMISSION PRINTED WIRING BOARD, PROBE CARD, AND PROBE APPARATUS

BACKGROUND OF THE INVENTION

1. Field of the Invention

The present invention relates to a printed wiring board for transmitting a high-frequency signal, a probe card using this printed wiring board, and a probe apparatus using this probe card.

2. Description of the Related Art

A large number of IC chips, i.e., semiconductor devices, are formed on a semiconductor wafer in accordance with, e.g., a micro-patterning technique, and the wafer is cut in units of IC chips. In the IC chip manufacturing process, conventionally, the electrical characteristics of the semi-finished IC chips are examined by using a probe apparatus before cutting the wafer, and only the IC chips that are determined as non-defective articles as the result of test measurement are sent to the following steps, e.g., packaging, thereby improving the productivity.

The probe apparatus for examining the electrical characteristics of the semi-finished IC chips formed on the semiconductor wafer has a probe card on which probes, i.e., contact elements are disposed to correspond to the electrode pads of each IC chip. A work table which is movable in horizontal directions (X and Y directions) and a vertical direction (Z direction) and rotatable in a θ direction is arranged below the probe card.

For examination, first, the work table is moved in the X, Y, and θ directions so that the electrode pads of each IC chip on the wafer oppose the corresponding probes of the probe card. Subsequently, the work table is moved upward so that the electrode pads of the IC chip are brought into electrical contact with the probes. These operations are performed in units of IC chips or in units of groups each consisting of a plurality of IC chips. When the electrode pads of the IC chip and the probes are in contact with each other, a high-frequency examination signal is sent from a tester to the IC chip, and the electrical characteristics of the IC chip are examined. As the operation speed of the IC chip is increased, the frequency of the examination signal is also increased to, e.g., about 100 MHz or more.

A plurality of reference conductive plates, which are flat and large and serve as reference levels of signal line impedance, are disposed in addition to signal lines, on a printed wiring board that transmits a high-frequency signal, e.g., a probe card or a printed wiring board used in the performance board of a test head. The reference conductive plates have DC reference potentials different from each other, e.g., a 0-V ground potential, a +5-V or +10-V positive potential, and the like. When the reference conductive plates are coupled to each other with capacitors having good high-frequency characteristics, they serve as equivalent reference levels of impedance for the signal lines.

FIGS. 12 and 13 are a schematic perspective view and a sectional view, respectively, showing the microstrip line structure of a conventional printed wiring board for transmitting a high-frequency signal. A signal line 2 is disposed on one surface, e.g., the upper surface, of an insulating layer 1, and two large-area reference conductive plates 3 and 4 are disposed on the other surface of the insulating layer 1. Although they are separated by a groove 5, the reference conductive plates 3 and 4 are capacitively coupled to each other through a capacitor 6, such that they are short-circuited for a high-frequency AC current. For example, a ground potential is applied to the reference conductive plate 3, and a +5-V potential is applied to the reference conductive plate 4. Thus, the DC potentials of the conductive plates 3 and 4 are different from each other.

In the structure shown in FIG. 12 and 13, the insulating groove 5 having a width of at least about 0.5 to 1 mm must be formed between the reference conductive plates 3 and 4 to insulate and separate them from each other in the DC manner. For this reason, impedances Z1 and Z3 of portions of the structure along the signal transmitting direction and corresponding to the reference conductive plates 3 and 4 and an impedance Z2 of a portion of the structure corresponding to the groove 5 largely differ. For example, whereas the impedances Z1 and Z3 are substantially equal, i.e., about 50 Ω, the impedance Z2 reaches as high as several 10 kΩ. Hence, if a high-frequency examination signal, e.g., a rectangular solitary pulse, travels as a traveling wave, a reflected wave is formed at a portion where the impedances do not match. In this case, the shape of the pulse of the test signal is disordered. Then, an appropriate examination may not be performed.

SUMMARY OF THE INVENTION

It is, therefore, an object of the present invention to provide a printed wiring board capable of accurately transmitting a high-frequency signal by suppressing a reflected wave caused by mismatching of impedances, a probe card using this printed wiring board, and a probe apparatus using this probe card. According to a first aspect of the present invention, there is provided a printed wiring board having a plurality of transmission paths for transmitting a high-frequency signal, comprising:

first and second insulating layers;

a plurality of signal lines disposed between the first and second insulating layers and respectively extending along the transmission paths;

a first reference conductive plate opposing the signal lines through the first insulating layer and applied with a first direct-current reference potential; and a second reference conductive plate opposing the signal lines through the second insulating layer and applied with a second direct-current reference potential which is different from the first direct-current reference potential, wherein the first and second reference conductive plates are arranged to be substantially offset from each other along each of the transmission paths, each of the transmission paths is substantially formed of a first portion constituted by a pair of one of the signal lines and the first reference conductive plate and a second portion constituted by a pair of said one of the signal lines and the second reference conductive plate, the first and second reference conductive plates is arranged to overlap each other at a boundary of the first and second portions of each of the transmission paths, and an overlapping amount is adjusted such that an impedance of the boundary of each of the transmission paths is substantially equal to that of each of the first and second portions of each of the transmission paths.

According to a second aspect of the present invention, there is provided a probe card for examining electrical characteristics of a target object having a plurality of electrode pads by using a high-frequency signal, comprising:

(a) a probe card body having contact elements for contacting the electrode pads;

(b) a printed wiring board having a plurality of transmission paths for transmitting the high-frequency signal to the contact elements, prepared in accordance with the first aspect of the present invention; and (c) means for mounting the probe card body to the printed wiring board.

According to a third aspect of the present invention, there is provided a probe apparatus, connected to a tester and used to examine electrical characteristics of a target object having a plurality of electrode pads by using a high-frequency signal, comprising:

(a) a work table for placing the target object thereon;

(b) a probe card body disposed above the work table and having contact elements for contacting the electrode pads;

(c) a printed wiring board having a plurality of transmission paths for transmitting the high-frequency signal to the contact elements, prepared in accordance with the first aspect of the present invention; and (d) means for mounting the probe card body to the printed wiring board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a partially sectional side view showing the probe card of the probe apparatus shown in FIG. 1 by combining its two orthogonal side surfaces at the center;

FIG. 4 is a perspective view of the card body of the probe card shown in FIG. 3;

DETAILED DESCRIPTION OF THE PREFERRED EMBODIMENTS

Figure 1:
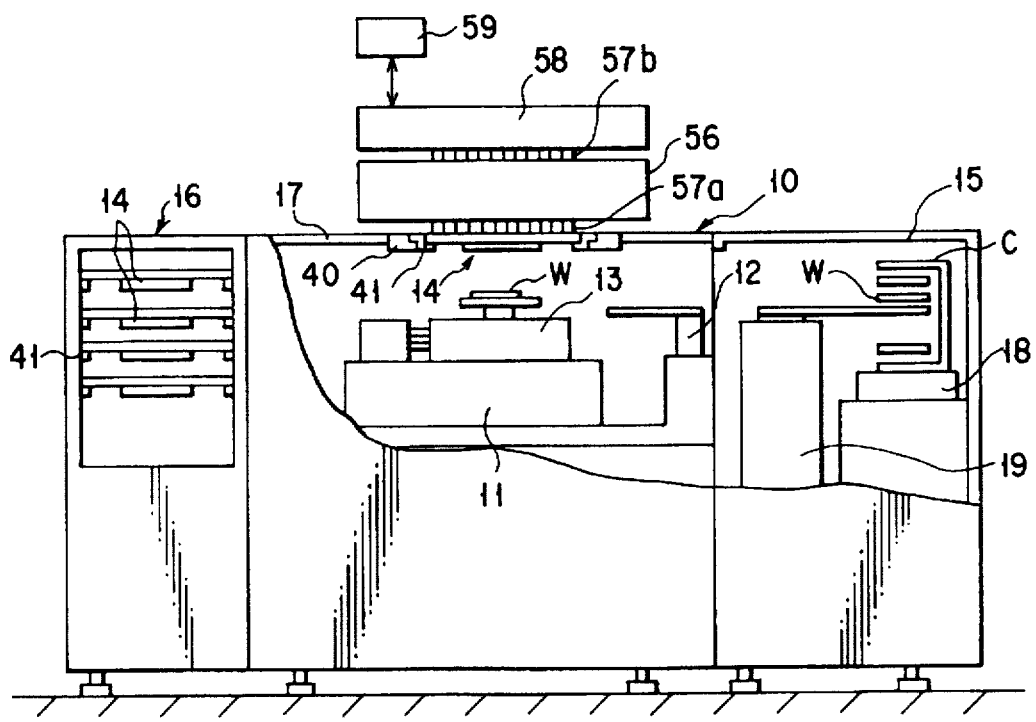
FIG. 1 is a schematic view showing the entire arrangement of a probe apparatus according to an embodiment of the present invention.

A probe apparatus according to an embodiment of the present invention which is shown in FIG. 1 is formed such that it examines the electrical characteristics of a plurality of IC chips formed on a semiconductor wafer. A main stage 11 is provided at substantially the center of an apparatus body 10 of the probe apparatus. A work table 13 having a horizontal work surface for placing a semiconductor wafer W thereon is disposed on the main stage 11. The main stage 11 is movable in X and Y directions within a horizontal plane together with the work table 13. An alignment unit (not shown) is provided on the front side of the center of the apparatus body 10. The alignment unit is provided with a camera serving as an image recognition unit for alignment. The work table 13 is moved to a portion below the work table 13 for the purpose of alignment.

An auto-loader 15 is disposed on the right side of the apparatus body 10. In the auto-loader 15, a wafer cassette C accommodating a large number of semiconductor wafers W at a predetermined gap with each other in the vertical direction is replaceably disposed on a cassette work table 18. A loader stage 19 which is movable within a horizontal plane and a wafer handling arm 12 which can be driven by a Y-direction drive mechanism and a Z-direction elevating mechanism are provided between the wafer cassette C and the work table 13.

When a semiconductor wafer W is to be examined with probes, the wafer W is conveyed by the loader stage 19 to be close to the work table 13, and is transferred onto the work table 13 by the wafer handling arm 12. After examination, the wafer W is transferred onto the loader stage 19 by the wafer handling arm 12, and is conveyed to the wafer cassette C by the loader stage 19.

An opening is formed in a head plate 17 of the apparatus body 10 disposed above the main stage 11, and an insert ring 40 is disposed in this opening. A probe card 14 is mounted to the insert ring 40 through a card holder 41. The probe card 14 is mounted on and detached from the insert ring 40 together with the card holder 41.

A contact ring 56 and a test head 58 are detachably arranged on the probe card 14. The contact ring 56 has conductive pins 57a and 57b extendible downward and upward, respectively. The contact ring 56 is electrically connected to a printed wiring board 42 of the probe card 14 through the conductive pins 57a and to the test head 58 through the conductive pins 57b. The test head 58 is connected to a tester 59. The tester 59 applies a predetermined power supply voltage and an examination pulse signal to the chip of the semiconductor wafer W and receives output signals from the chip, thereby deciding whether or not the chip is non-defective.

A probe card exchanger 16 is disposed on the left side of the apparatus body 10. A plurality of types of probe cards 14 respectively mounted on the card holders 41 are accommodated in the probe card exchanger 16 at a predetermined gap with each other in the vertical direction.

Figure 2:
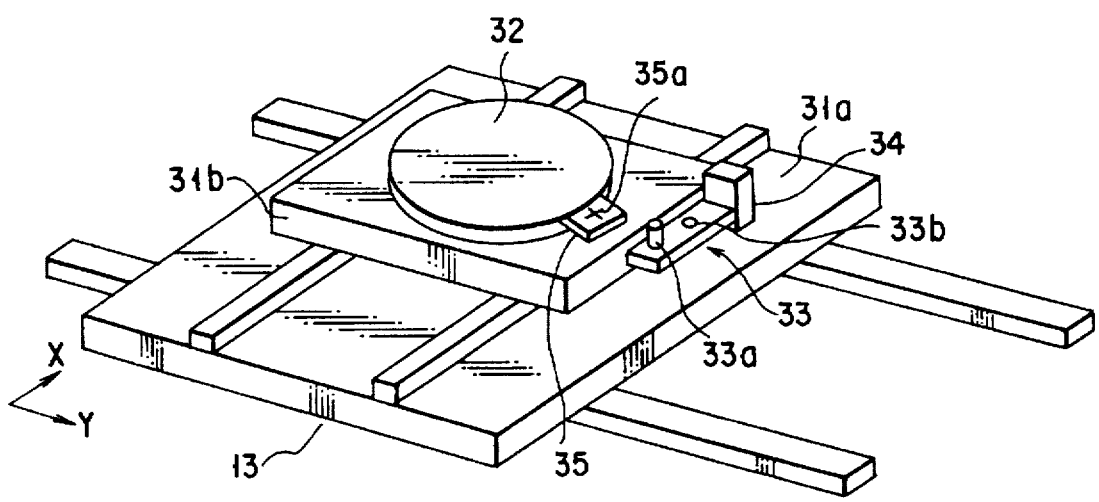
FIG. 2 is a perspective view showing the work table of the probe apparatus shown in FIG. 1.

As shown in FIG. 2, the work table 13 has a Y stage 31a movable in the Y direction along two rails extending in the Y direction, and an X stage 31b movable in the X direction along two rails extending in the X direction on the Y stage 31a. The Y and X stages 31a and 31b are driven in the Y and X directions, respectively, within a horizontal plane by a general drive mechanism including a pulse motor and the like. A chuck 32 mounted on the X stage 31b is driven by a known elevating mechanism in the vertical direction (Z direction) and is rotated about a vertical center line extending through its center by a known rotating mechanism.

An elevating member 34 is fixed to a side surface of the X stage 31b. The elevating member 34 holds a movable camera 33 which is movable in the vertical direction. The movable camera 33 is constituted by high- and low-magnification portions 33a and 33b.

A small segment 35 is fixed to a side surface of the chuck 32 to project horizontally in the radial direction of the chuck 32. The small segment 35 is made of a strip-shaped transparent plate on which a target 35a, defined by the center of a cross mark drawn by using a conductive thin film, e.g., an ITO (Indium Tin Oxide) thin film or chromium, is formed. The target 35a serves as a reference point when detecting X, Y, and Z positions by the movable camera 33. A conductive transparent thin film, e.g., an ITO thin film, is disposed around the cross-shaped thin film to cover it. The conductive transparent thin film is provided to enable positional detection in the Z direction by an electrostatic capacitive sensor.

The small segment 35 on which the target 35a is formed can be moved onto the optical axis of the high-magnification portion of the movable camera 33 and can be retreated from the optical axis by rotation of the chuck 32. The small segment 35 may be detachably mounted to the chuck 32.

As shown in FIG. 3, the probe card 14 has a card body 21, the printed wiring board 42, and a support block 50 for mounting the card body 21 on the printed wiring board 42. In the partially sectional side view of FIG. 3, the orthogonal two side surfaces of the probe card 14 are combined at the center.

Figure 5:
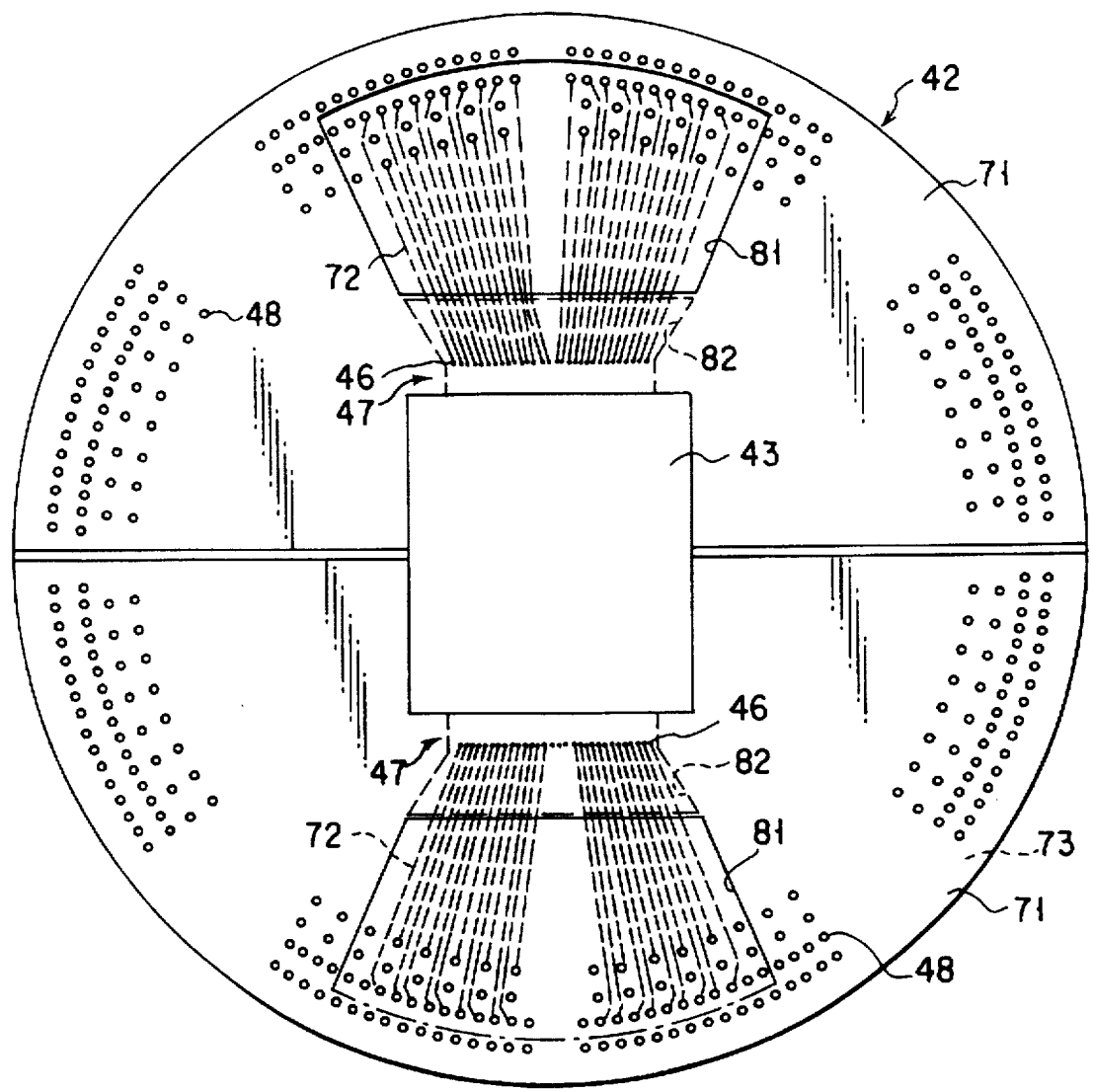
FIG. 5 is a plan view showing the printed wiring board of the probe card shown in FIG. 3.

The printed wiring board 42 has the shape of a circular plate, as shown in FIG. 5, and a rectangular central opening 43 is formed at the center of the printed wiring board 42. The printed wiring board 42 has a multi-layered structure in which a plurality of insulating layers 44 and printed conductive layers 45 are stacked alternately. The insulating layers 44 are made of a hard glass cloth epoxy resin having a high mechanical strength, and the printed conductive layers 45 are made of copper, a copper alloy, or the like. As will be described later in detail, for example, the two uppermost insulating layers 44 and three printed conductive layers 45 of the printed wiring board 42 constitute the microstrip line structure for transmitting a high-frequency signal, which is the main part of the present invention.

The support block 50 having a rectangular planer shape is supported by the printed wiring board 42 and projects downward through the central opening 43. The support block 50 is made of a highly rigid material, e.g., stainless steel, aluminum, or the like. The support block 50 has a flange 51 extending in the right-to-left on the printed wiring board 42. The flange 51 and the printed wiring board 42 are integrally fixed to each other with screws 52a and nuts 52b mounted in holes formed in them. The card body 21 is detachably mounted to the lower surface of the support block 50 with screws 54.

The card body 21 has a rectangular membrane 22 made of a flexible insulating material, e.g., a polyimide resin, a silicone resin, or the like, and a flexible printed circuit (FPC) 23 is formed on the membrane 22 and made of copper, a copper alloy, or the like. Connector portions 24 each having a plurality of electrode pads 25 connected to the flexible printed circuit 23 are disposed on the two end portions of the membrane 22 in the longitudinal direction. A hard insulating resin plate in which a through hole 26 is formed is adhered to each connector portion 24.

Connector portions 47 each having a plurality of electrodes 46 are similarly provided on the upper surfaces of portions of the printed wiring board 42 on the two sides of the central opening 43. The connector portions 47 of the printed wiring board 42 and the connector portions 24 of the card body 21 are detachably connected to each other with screws 53a and nuts 53b mounted in holes (including the through holes 26 described above) formed in them. A plurality of electrodes 48 for achieving contact with the pins 57a of the contact ring 56 are disposed on the peripheral portion of the printed wiring board 42.

A main area 27, on which a large number of contact elements 28 connected to the flexible printed circuit 23 and made of gold, a gold alloy, or the like are arranged, is formed at the center of the lower surface of the membrane 22 of the card body 21. The main area 27 is formed into almost the same size as that of one device, i.e., one chip, of the semiconductor wafer W. The contact elements 28 are arranged to correspond to electrode pads EP of the chip and project from the lower surface of the membrane 22.

A rectangular frame 29 made of a rigid material, e.g., aluminum, is integrally adhered to the upper surface of the membrane 22 located around the main area 27. The frame 29 is flat and has a uniform thickness, and makes flat the main area 27 of the card body 21 surrounded by it and the portion around the main area 27. The frame 29 is detachably fixed to the lower surface of the support block 50 with the screws 54.

A pusher 55 made of a highly rigid material is disposed on the opposite side of the main area 27 of the card body 21. The pusher 55 is mounted in a recessed portion of the support block 50 through a swing member or expansion member. By the operation of the pusher 55, the contact elements 28 of the main area 27 are brought into reliable contact with the electrode pads EP of the semiconductor wafer W.

Figure 7:
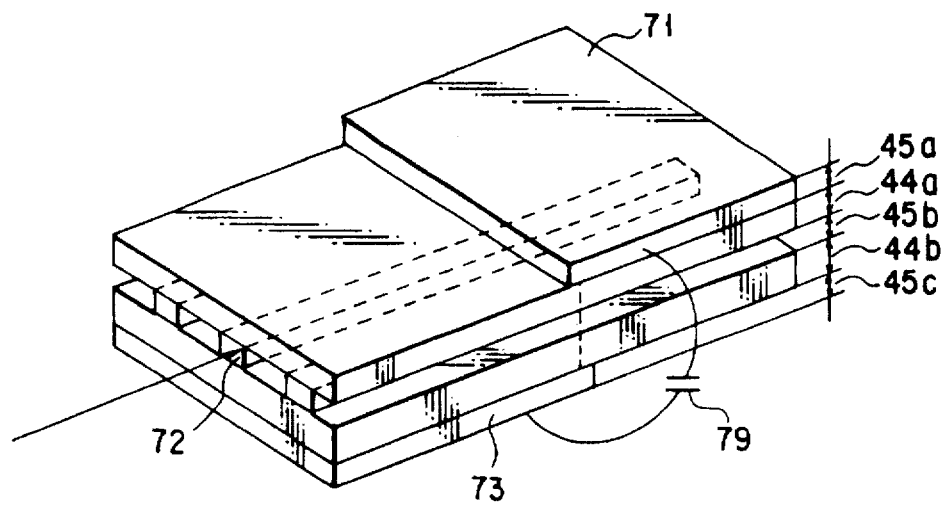
FIG. 7 is an enlarged perspective view schematically showing the characteristic portion of the printed wiring board of the probe card shown in FIG. 3.
Figure 8:
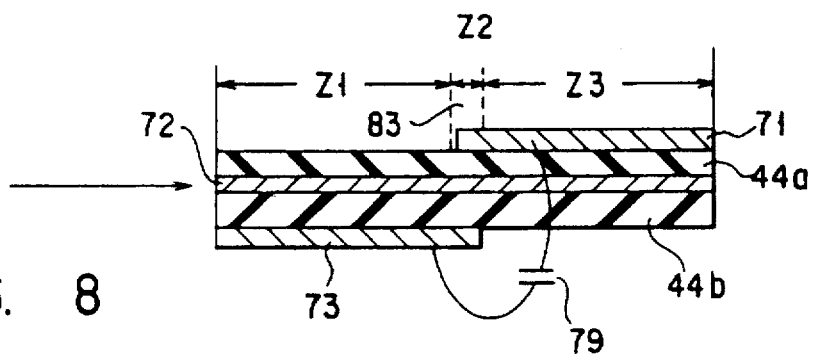
FIG. 8 is a sectional view of the structure shown in FIG. 7.

FIGS. 7 and 8 show the main part of the microstrip line structure of the printed wiring board 42 that transmits a high-frequency signal of, e.g., about 100 MHz or more. The microstrip line structure is constituted by, e.g., two insulating layers 44a and three conductive layers 45a, 45b, and 45c of the uppermost portion of the printed wiring board 42.

Each of the insulating layers 44a and 44b has a thickness of about several 100 μm, and is made of a glass cloth epoxy resin having a dielectric constant $\epsilon_r$ of 4.8 in this embodiment. Any other insulating material, e.g., a phenol resin, a polyimide resin, or Teflon may be used in place of the glass cloth epoxy resin. Each of the conductive layers 45a, 45b, and 45c is made of copper, a copper alloy, or the like, and is printed on the insulating layer 44a or 44b as it is patterned into a predetermined shape. As shown in FIG. 5, the upper and lower conductive layers 45a and 45c are patterned to have substantially the same outline as that of the printed wiring board 42, and are respectively used as reference conductive plates 71 and 73 to which different DC potentials are applied (i.e., a different direct-current reference potential is applied to plate 71 than to plate 73). In contrast to this, the conductive layer 45b at the center is patterned into a plurality of thin signal lines 72.

Figure 6:
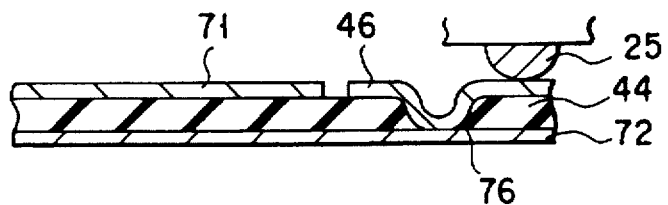
FIG. 6 is a sectional view showing the contact electrode of a signal line shown in FIG. 5.

The electrodes 46 (or 48) on the upper surface of the printed wiring board 42 and the signal lines 72 are connected in the manner as shown in FIG. 6. The electrodes 46 (or 48)

are made of portions that have been separated from the reference conductive plate 71 by etching, and are connected to the signal lines 72 through small holes 76 formed in the insulating layer 44a. In order to form this structure, the small holes 76 are formed in the insulating layer 44a before printing the conductive layer 45a on the insulating layer 44a. Subsequently, the conductive layer 45a is printed on the insulating layer 44a to include portions serving as the prospective electrodes 46. The electrodes 46 are separated from the reference conductive plate 71 by etching. By doing so, connection of the electrodes 46 and the signal lines 72 can be achieved only by forming the very small holes 76, and the high-frequency characteristics of the portions of the printed wiring board 42 where the electrodes 46 are formed will not be impaired.

The reference conductive plate 71 on the upper side is formed of two semi-circular portions, as shown in FIG. 5. Openings 81 are formed at portions of the reference conductive plate 71 corresponding to the signal lines 72 and closer to the peripheral edge of the printed wiring board 42. The reference conductive plate 73 on the lower side is formed as one circular plate. Openings 82 are formed at portions of the reference conductive plate 73 corresponding to the signal lines 72 and closer to the central opening 43 of the printed wiring board 42. Accordingly, regarding the relationship with respect to the signal lines 72, the upper and lower reference conductive plates 71 and 73 are arranged above and below the signal lines 72 in an offset manner such that they slightly overlap each other at a boundary portion 83, as shown in FIGS. 7 and 8.

For example, a 0-V ground potential is applied to the lower reference conductive plate 73, and a +5-V positive potential is applied to the upper reference conductive plate 73. The upper and lower reference conductive plates 71 and 73 are coupled to each other through a capacitor 79 such that they are short-circuited for a high-frequency wave. An high-frequency signal is transmitted from the electrodes 48 on the peripheral portion of the printed wiring board 42 to the boundary portion 83 through the pair of the lower reference conductive plate 73 and each of the signal lines 72, and from the boundary portion 83 to the electrodes 46 in the vicinity of the central opening 43 through the pair of the upper reference conductive plate 71 and each of the signal lines 72.

Figure 9:
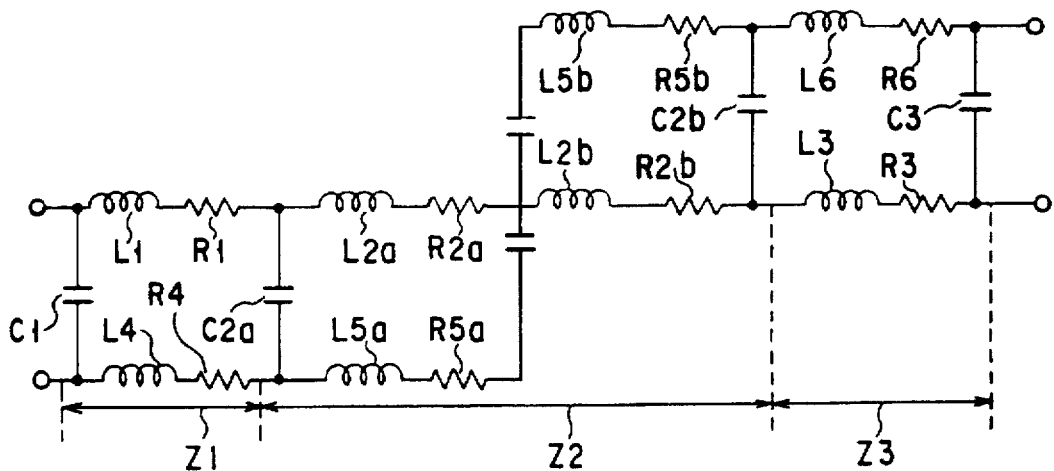
FIG. 9 is an equivalent circuit diagram of the structure shown in FIG. 7.

In the structure shown in FIGS. 7 and 8, impedances are formed that are defined by the distributed parameter circuits of the respective portions along the transmitting direction of the high-frequency signal, as shown in FIG. 9. An equivalent circuit of these distributed parameter circuits can be expressed by a series connection of inductances L1 to L6 and resistors R1 to R6, and capacitors C1 to C3 among the reference conductive plate 71, the signal lines 72, and the reference conductive plate 73. Assume that the impedance of a portion of the transmission path corresponding to the lower reference conductive plate 73 is defined as Z1, the impedance of a portion of the transmission path corresponding to the boundary portion 83 of the upper and lower reference conductive plates 71 and 73 is defined as Z2, and the impedance of a portion of the transmission path corresponding to the upper reference conductive plate 71 is defined as Z3.

Figure 10A:
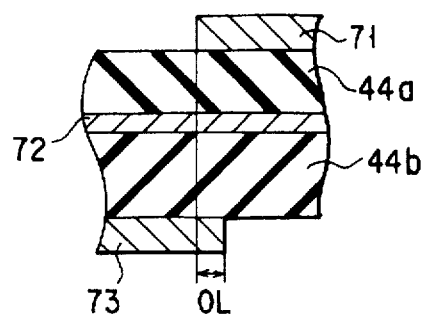
FIG. 10A is an enlarged sectional view showing the main part of the structure shown in FIG. 7.
Figure 10B:
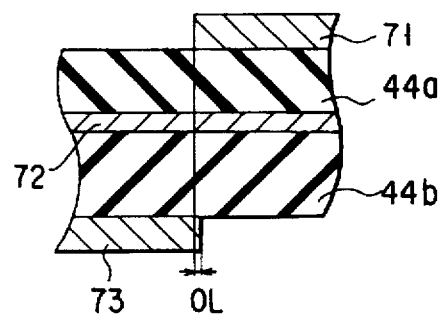
FIG. 10B is an enlarged sectional view showing a modification of the main part of the structure shown in FIG. 7.

The present inventor has discovered that the impedance Z2 of the transmission path portion corresponding to the boundary portion 83 can be adjusted by changing an overlapping amount OL (see FIG. 10A) of the boundary portion 83 of the upper and lower reference conductive plates 71 and 73. More specifically, when the overlapping amount OL of the reference conductive plates 71 and 73 is adjusted, the impedance Z2 at the transmission path portion corresponding to the boundary portion 83 can be set equal to the impedances Z1 and Z3 of the transmission path portions respectively corresponding to the reference conductive plates 73 and 71. Regarding setting of the overlapping amount OL, the larger the thickness of the insulating layers 44b and 44a, the larger the overlapping amount OL. On the other hand, the larger the dielectric constant of the insulating layers 44b and 44a, or the thickness or the width of the signal lines 72, the smaller the overlapping amount OL. Accordingly, sometimes the overlapping amount OL must be set to almost 0, as shown in FIG. 10B.

For example, the impedances Z1 and Z3 of the transmission path portions respectively corresponding to the reference conductive plates 73 and 71 become about 50 Ω. Accordingly, the overlapping amount OL of the reference conductive plates 71 and 73 is adjusted such that the impedance Z2 of the transmission path portion corresponding to the boundary portion 83 also becomes about 50 Ω.

The transmission path of the high-frequency signal which is mentioned here is a microstrip line structure which is constituted by pairs each constituted by each signal line 72 and either one of the reference conductive plates 71 and 73 at respective positions along the transmission path. Accordingly, the reference conductive plates 71 and 73 are arranged not to overlap except the boundary portion 83. For example, when a glass cloth epoxy resin having a thickness of about 150 μm and a dielectric constant $\epsilon_r$ of about 4.8 is used as the material of the insulating layers 44a and 44b and copper or a copper alloy having a thickness of about 35 μm is used as the material of the conductive layers 45a, 45b, and 45c, the desirable range of the overlapping amount OL is about 50 μm to 150 μm.

In the high-frequency signal transmission path having the above arrangement, a pulse train of a high-frequency signal of, e.g., 100 MHz or more, which causes a problem in the conventional structure, is input to the signal lines 72 as a wave traveling in the positive direction. However, the impedances Z1, Z2, and Z3 at the transmission path portions respectively corresponding to the reference conductive plate 73, the boundary portion 83, and the reference conductive plate 71 are set to almost the same value, e.g., about 50 Ω. Thus, an input traveling wave is not substantially reflected, and the coefficient of reflection becomes almost 0. As the incident voltage is not influenced by the reflected voltage, the pulse signal can be transmitted without being substantially disordered in its waveform. In other words, since the signal can be transmitted without being disordered in its waveform, an examination error accompanying deformation of a signal wave is eliminated.

Figure 11A:
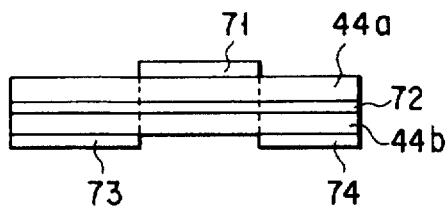
FIGS. 11A and 11B are schematic sectional views showing modifications of the structure shown in FIG. 7.
Figure 11B:
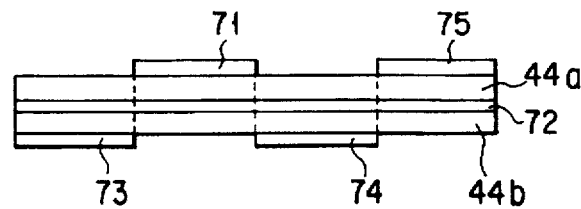
Figure 12:
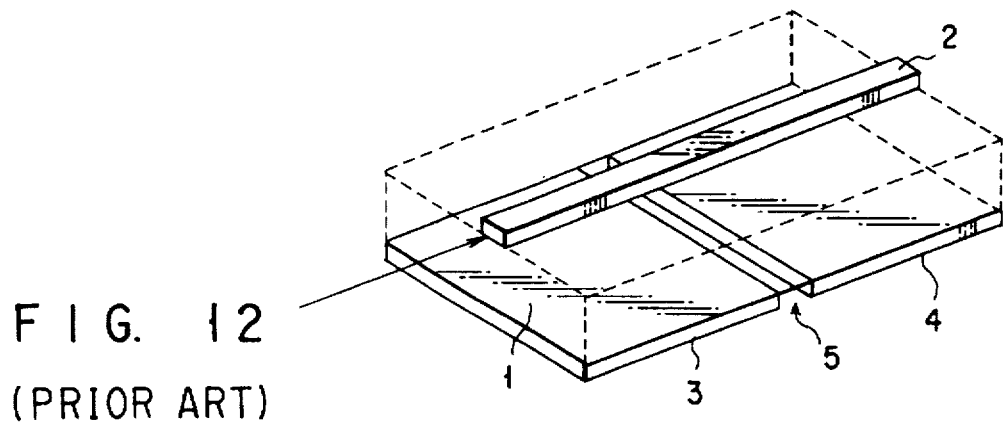
FIG. 12 is an enlarged perspective view schematically showing a portion of a conventional printed wiring board for transmitting a high-frequency signal, which corresponds to the structure shown in FIG. 7.
Figure 13:
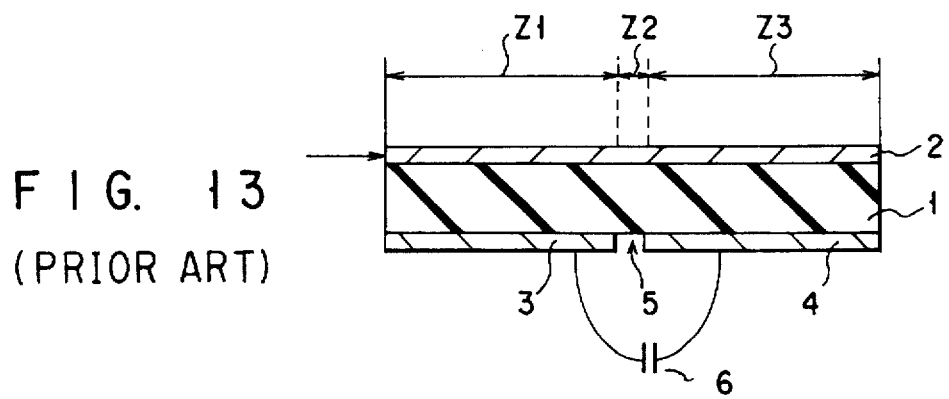
FIG. 13 is a sectional view of the structure shown in FIG. 12.

In the above embodiment, a printed wiring board having two reference levels, i.e., a ground potential and +5 V, has been described. However, the present invention can similarly be applied to a printed wiring board having three or more reference levels. For example, in the modification shown in FIG. 11A, in addition to the two reference conductive plates 73 and 71, a third reference conductive plate 74 having a DC potential of, e.g., +10 V, is disposed. In the modification shown in FIG. 11B, a fourth reference conductive plate 75 is further disposed. In either case, the overlapping amount of the respective reference conductive plates is set such that the impedances of the signal line have required values.

In the above embodiment, the membrane-type probe card 14 has been described. However, the present invention can similarly be applied to a probe card having vertical probe needles or a probe card having oblique probe needles. The present invention is not limited to the printed wiring board 42 of the probe card 14, but can also be applied to other printed wiring boards for transmitting a high-frequency signal, e.g., the performance board of the test head 58. Furthermore, the present invention not limited to the probe apparatus of a semiconductor wafer, but can also be applied to a probe apparatus for examining the electrical characteristics of other target objects, e.g., an LCD substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A printed wiring board having a plurality of transmission paths for transmitting a high-frequency signal, comprising:

first and second insulating layers;

a plurality of signal lines disposed between said first and second insulating layers and respectively extending along said transmission paths;

a first reference conductive plate opposing said signal lines through said first insulating layer and applied with a first direct-current reference potential;

a second reference conductive plate opposing said signal lines through said second insulating layer and applied with a second direct-current reference potential which is different from the first direct current reference potential and a capacitor coupling the first and second reference conductive plates such that said first and second reference conductive plates are short circuited for a high frequency wave;

wherein said first and second reference conductive plates are arranged to be substantially offset from each other along each of said transmission paths, each of said transmission paths is substantially formed of a first portion constituted by a pair of one of said signal lines and said first reference conductive plate and a second portion constituted by a pair of said one of said signal lines and said second reference conductive plate, said first and second reference conductive plates are arranged to overlap each other at a boundary of said first and second portions of each of said transmission paths, and an overlapping amount of the first and second reference conductive plates is set such that an impedance of said boundary of each of said transmission paths is substantially equal to that of each of said first and second portions of each of said transmission paths.

2. A board according to claim 1, wherein the overlapping amount is set such that the larger the thickness of said first and second insulating layers, the larger the overlapping amount.

3. A board according to claim 1, wherein the overlapping amount is set such that the larger the dielectric constant of said first and second insulating layers, or the thickness or the width of said signal lines, the smaller the overlapping amount.

4. A board according to claim 1, further comprising a plurality of electrodes connected to end portions of said signal lines, said electrodes being arranged on substantially the same plane as said second reference conductive plate.

5. A board according to claim 4, wherein said electrodes are originated from a conductive layer common with said second reference conductive plate.

6. A board according to claim 1, wherein said transmission paths are formed to transmit a high-frequency signal to contact elements of a probe card body, and said contact elements are disposed to be brought into contact with electrode pads of an examination target.

7. A board according to claim 6, further comprising means for supporting said probe card body.

8. A board according to claim 7, wherein an opening for arranging said probe card body therein is formed at substantially the center of said printed wiring board, and said signal lines are radially arranged around the opening.

9. A probe card for examining electrical characteristics of a target object having a plurality of electrode pads by using a high-frequency signal, comprising:

(a) a probe card body having contact elements for contacting said electrode pads;

(b) a printed wiring board having a plurality of transmission paths for transmitting the high-frequency signal to said contact elements, said printed wiring board comprising:

first and second insulating layers, a plurality of signal lines disposed between said first and second insulating layers and respectively extending along said transmission paths, a first reference conductive plate opposing said signal lines through said first insulating layer and applied with a first direct-current reference potential, a second reference conductive plate opposing said signal lines through said second insulating layer and applied with a second direct-current reference potential which is different from the first direct current reference potential, and a capacitor coupling the first and second reference conductive plates such that said first and second reference conductive plates are short circuited for a high frequency wave, said first and second reference conductive plates being arranged to be substantially offset from each other along each of said transmission paths, each of said transmission paths being substantially formed of a first portion constituted by a pair of one of said signal lines and said first reference conductive plate and a second portion constituted by a pair of said one of said signal lines and said second reference conductive plate, said first and second reference conductive plates being arranged to overlap each other at a boundary of said first and second portions of each of said transmission paths, and an overlapping amount of said first and second reference conductive plates is set such that an impedance of said boundary of each of said transmission paths is substantially equal to that of each of said first and second portions of each of said transmission paths; and (c) means for mounting said probe card body to said printed wiring board.

10. A card according to claim 9, wherein the overlapping amount is set such that the larger the thickness of said first and second insulating layers, the larger the overlapping amount.

11. A card according to claim 9, wherein the overlapping amount is set such that the larger the dielectric constant of said first and second insulating layers, or the thickness or the width of said signal lines, the smaller the overlapping amount.

12. A card according to claim 9, wherein said printed wiring board further comprises a plurality of electrodes connected to end portions of said signal lines, said electrodes being arranged on substantially the same plane as said second reference conductive plate.

13. A card according to claim 12, wherein said electrodes of said printed wiring board are originated from a conductive layer common with said second reference conductive plate.

14. A card according to claim 9, wherein an opening for arranging said probe card body therein is formed at substantially the center of said printed wiring board, and said signal lines are radially arranged around the opening.

15. A probe apparatus, connected to a tester and used to examine electrical characteristics of a target object having a plurality of electrode pads by using a high-frequency signal, comprising:

(a) a work table for placing the target object thereon;

(b) a probe card body disposed above said work table and having contact elements for contacting said electrode pads;

(c) a printed wiring board having a plurality of transmission paths for transmitting the high-frequency signal to said contact elements, said printed wiring board comprising;

first and second insulating layers, a plurality of signal lines disposed between said first and second insulating layers and respectively extending along said transmission paths, a first reference conductive plate opposing said signal lines through said first insulating layer and applied with a first direct-current reference potential, a second reference conductive plate opposing said signal lines through said second insulating layer and applied with a second direct-current reference potential which is different from the first direct-current reference potential, and a capacitor coupling the first and second reference conductive plates such that said first and second reference conductive plates are short circuited for a high frequency wave, said first and second reference conductive plates being arranged to be substantially offset from each other along each of said transmission paths, each of said transmission paths being substantially formed of a first portion constituted by a pair of one of said signal lines and said first reference conductive plate and a second portion constituted by a pair of said one of said signal lines and said second reference conductive plate, said first and second reference conductive plates being arranged to overlap each other at a boundary of said first and second portions of each of said transmission paths, and an overlapping amount of said first and second reference conductive plates is set such that an impedance of said boundary of each of said transmission paths is substantially equal to that of each of said first and second portions of each of said transmission paths; and (d) means for mounting said probe card body to said printed wiring board.

16. An apparatus according to claim 15, wherein the overlapping amount is set such that the larger the thickness of said first and second insulating layers, the larger the overlapping amount.

17. An apparatus according to claim 15, wherein the overlapping amount is set such that the larger the dielectric constant of said first and second insulating layers, or the thickness or the width of said signal lines, the smaller the overlapping amount.

18. An apparatus according to claim 15, wherein said printed wiring board further comprises a plurality of electrodes connected to end portions of said signal lines, said electrodes being arranged on substantially the same plane as said second reference conductive plate.

19. An apparatus according to claim 18, wherein said electrodes of said printed wiring board are originated from a conductive layer common with said second reference conductive plate.

20. An apparatus according to claim 15, wherein an opening for arranging said probe card body therein is formed at substantially the center of said printed wiring board, and said signal lines are radially arranged around the opening.

* * * * *